United States Patent [19]

Cornett

[11] Patent Number: 4,825,173

[45] Date of Patent: Apr. 25, 1989

[54] HIGH GAIN, PROGRAMMABLE DIFFERENTIAL AMPLIFIER CIRCUITRY

[75] Inventor: Frank N. Cornett, Queen Creek, Ariz.

[73] Assignee: Motorola, Inc., Schaumburg, Ill.

[21] Appl. No.: 145,933

[22] Filed: Jan. 18, 1988

[51] Int. Cl.[4] .............................................. H03F 3/45
[52] U.S. Cl. .................................... 330/252; 330/254; 330/258
[58] Field of Search ............... 330/252, 254, 258, 259, 330/260, 261

[56] References Cited

U.S. PATENT DOCUMENTS 4,272,728  6/1981  Wittlinger .................... 330/258 X
4,288,754  9/1981  Okada et al. ..................... 330/260

Primary Examiner—Steven Mottola
Attorney, Agent, or Firm—Maurice J. Jones

[57] ABSTRACT

An amplifier includes a first differential pair of transistors with commonly connected input electrodes also connected to a variable current sink. A common mode voltage control circuit includes a second differential pair of transistors, one of which has a control electrode coupled to the output electrodes of the first differential pair. The second differential pair provides control signals to the variable current sink to regulate the common mode output voltage. Current control circuitry is coupled to the variable current sink to allow adjustment of the gain, bandwith or power dissipation of the first differential pair.

11 Claims, 3 Drawing Sheets

HIGH GAIN, PROGRAMMABLE DIFFERENTIAL AMPLIFIER CIRCUITRY

BACKGROUND OF THE INVENTION

The present invention relates to solid state, high gain differential amplifier circuitry and more particularly to such circuitry having an electronically controllable current and common mode voltage.

Many present day electronic systems such as those including filters could utilize high gain, high frequency differential amplifier circuitry having electronically controllable characteristics which can be manufactured in monolithic integrated circuit form and which has a wide enough bandwidth to handle from direct current (d.c.) to radio frequencies (RF). Fast acquisition demodulators, for instance, require active filters which can be electronically switched from a wide bandwidth to a narrow bandwidth. More specifically, such filter circuitry is required to provide the wide bandwidth until a desired input signal is acquired and then be switchable to the narrow bandwidth without losing the received signal which is then demodulated. Still other applications require filter circuitry having bandwidths that are continuously adjustable from 0 Hertz (Hz) to many Megahertz (MHz), in response to control signals or which can be switched from band reject to low pass operation, for instance.

Prior art circuits for use in filters having electronically adjustable bandwidths suitable for operation at audio frequencies (AF) are generally unsuitable for operation at RF because of the transport delay within such circuits. These circuits may have reactive networks connected in series with the signal path therein. Such networks provide signal delay that becomes more significant as the frequency of operation increases thus limiting the usable frequency range thereof.

Also, some prior art configurations tend to undesirably provide electrical transients or shifts in bias levels when switched from one bandwidth to another. These level shifts and transients can have an adverse effect of the linearity and dynamic range of such circuits. Although the foregoing circuits may be useful for many applications, they are not suitable for some sensitive, high frequency filter applications, for instance.

Because of their many inherent advantages, it is desired to use a differential amplifier configuration in monolithic form to solve the above and other problems. Some prior art monolithic differential amplifier circuits, however, include resistive loads connected to the collectors of the differentially connected transistors. Since the gain of a differential amplifier circuit varies directly with the load impedance, monolithic resistors which typically have low values do not provide sufficient gain for some sensitive applications. Other monolithic prior art differential amplifier configurations include PNP transistors connected to the collector electrodes of the differentially connected transistors to form differential-to-single ended converter circuits which are required to switch at the frequency of the dynamic signal being amplified. Unfortunately, it is difficult to manufacture high quality high frequency PNP transistors in monolithic integrated circuit form by commonly used present day processes. More specifically, such PNP transistors may have a unity gain cutoff frequency of about 20 MHz whereas the NPN transistors manufactured by such processes have a unity gain cutoff frequency of about 6 gigahertz (GHz). Also, the operating characteristics of these PNP transistors tend to vary with temperature, etc., thereby tending to adversely change the common mode voltage of the differential amplifier.

Direct coupled active loads often require that the common mode voltage of a differential amplifier remain substantially constant for a particular application. It is also desirable that the common mode voltage be adjustable to accommodate any one of a variety of direct coupled loads. Also, it is desirable for the main current of the differential amplifier to be adjustable to control gain, bandwidth and power dissipation.

SUMMARY OF THE INVENTION

Accordingly, it is an object of the present invention to provide improved, high gain differential amplifier circuitry.

Another object of the present invention is to provide differential amplifier circuitry which compensates for effects which tend to unbalance the common mode voltage thereof and which has an externally settable common mode voltage.

Yet another object of the invention is to provide differential amplifier configurations suitable for use in filter circuitry having electronically controllable current to control the frequency selective characteristics thereof and which are suitable for operation from baseband to RF.

A further object of the present invention is to provide differential amplifier circuitry which can be readily manufactured by high yielding, inexpensive modern integrated circuit manufacturing processes.

Still another object of the present invention is to provide low power, variable bandwidth circuitry having bandwidths or power dissipation that can be electronically changed without creating transients.

An additional object of the present invention is to provide an improved differential amplifier circuitry having a differential output signal, and desirable linearity and dynamic range characteristics.

The above and other objects and advantages of various implementations of the present invention are achieved by utilizing a signal processing differential amplifier having a first pair of differentially connected transistors. A first variable current sink is connected to the commonly connected input electrodes of the first differential pair. A common mode regulator includes a second differential pair having third and fourth transistors. The input electrodes of the third and fourth transistors are connected together at a node. A second variable current sink is connected to the second node. The output electrodes of the first differential pair are coupled to apply the common mode potential to the control electrode of the third transistor. A regulated potential is coupled to the control electrode of the fourth transistor. The second differential pair compares the common mode potential to the magnitude of the regulated potential and provides a control signal having a magnitude that is proportional to any difference therebetween at the output electrode of the fourth transistor. The control electrode of the first variable current sink is coupled to receive the control signal from the output electrode of the fourth transistor. The first variable current sink responds to the control signal to regulate the average of the potential magnitudes on the output electrodes of the transistors of the first differential pair to the substantially constant level.

Reactive networks can be connected between the output electrodes of the transistors of the first differential pair to provide an active filter configuration. PNP current sources can be coupled to the output electrodes of the transistors of the first differential pair to enable them to have a high gain. Buffer circuits are utilized to isolate the signal processing circuits from otherwise undesirable signals such as those provided by the PNP current sources. Also control circuitry can be utilized to adjust the magnitude of the bias current conducted by the variable current sink and the PNP current sources so that the gain, bandwidth or power dissipation of the amplifier is adjusted in accordance with the magnitude of this bias current.

Other objects, features and advantages of the subject invention is well as the foregoing objects will become more apparent from the following detailed description of the principles and embodiments of this invention when taken in conjunction with the accompanying drawings.

BRIEF DESCRIPTION OF THE DRAWINGS

A more complete understanding of the present invention may be derived by reference to the detailed description and claims when considered in connection with the accompanying drawings wherein:

DETAILED DESCRIPTION OF THE PREFERRED EMBODIMENT

Figure 1:
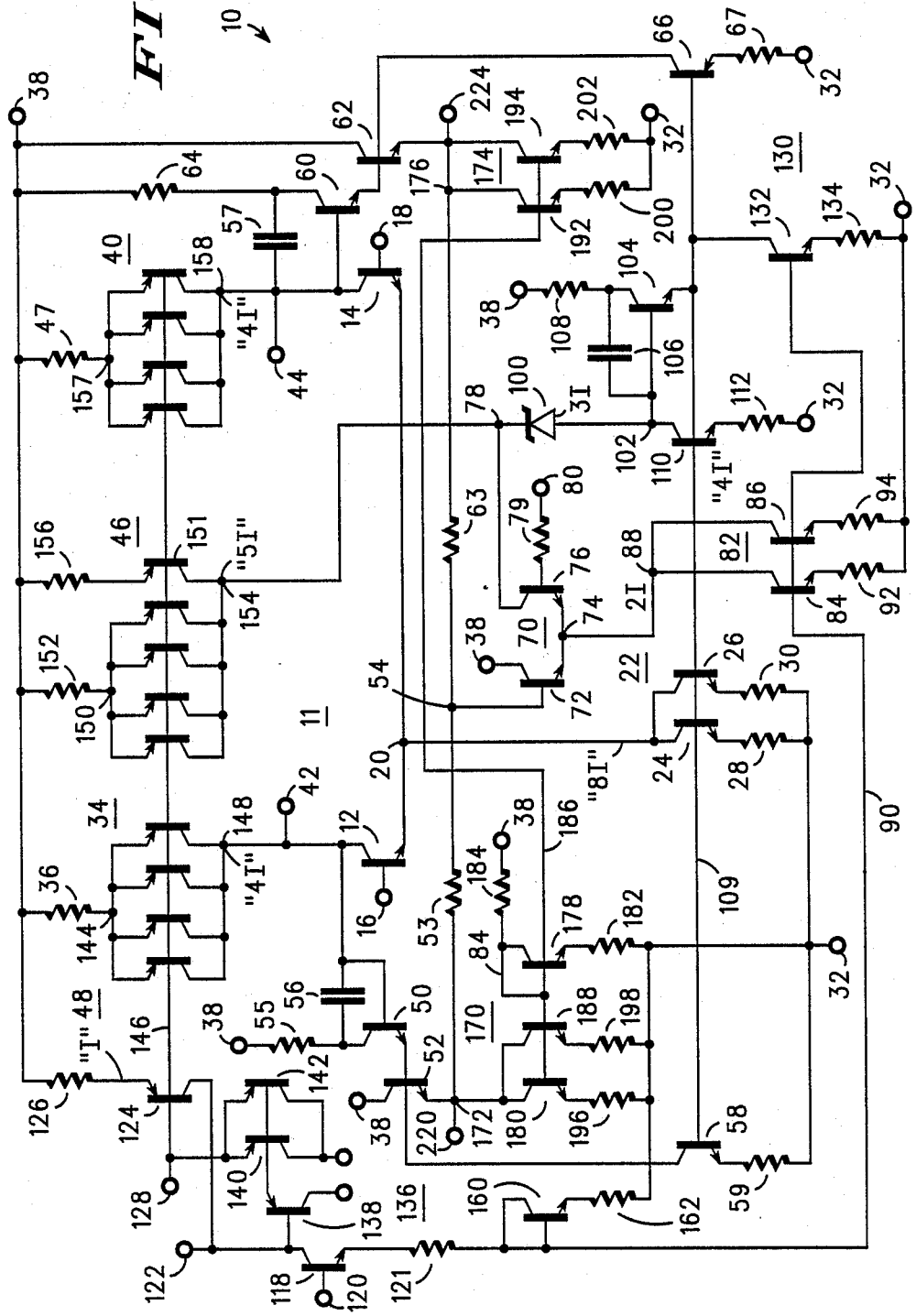
FIG. 1 is a schematic diagram showing the portions of a differential amplifier of one embodiment which can be fabricated in monolithic integrated circuit form.

Referring now to the drawings, FIG. 1 is the schematic diagram of a signal processing circuit 10 which is suitable for being provided in monolithic integrated circuit form. Circuit 10 includes a differential amplifier 11 having a pair of differentially connected transistors 12 and 14 each having emitter, base and collector electrodes. The base electrodes of transistors 12 and 14 are respectively connected to signal input terminals 16 and 18. Also, the emitters of transistors 12 and 14 are connected together at node 20. Current sink 22 of amplifier 11 includes NPN transistors 24 and 26 each having emitter, base and collector electrodes. Commonly connected collector electrodes of transistors 24 and 26 are connected to node 20. Resistors 28 and 30 connect the emitter electrodes of respective transistors 24 and 26 to a conductor 32 which is adapted to receive a negative power supply potential. The collector electrode of differential transistor 12 is coupled through PNP current source 34 including resistor 36 to terminal 38 which is adapted to receive a positive power supply potential. Similarly, the collector electrode of differential transistor 14 is coupled through PNP current source 40 including resistor 47 to positive power supply terminal 38.

Under dynamic operating conditions, a differential signal is provided between terminals 42 and 44 which are respectively connected to the collectors of differential transistors 12 and 14. Differential amplifier 11 is suitable for receiving a differential input signal between terminals 16 and 18 and providing the differential output between terminals 220 and 224 which is a processed version of this input signal. The input signal can have frequency components from 0 $H_z$ up to hundreds of $MH_z$.

The gain of differential amplifier configuration 11 is proportional to the value of the load resistances connected to the collectors of transistors 12 and 14. PNP constant current sources 34 and 40 provide a high load resistance on the order of 3 kilo-ohms which enables differential amplifier circuit 11 to have a high gain relative to if current sources 34 and 40 were replaced with typical monolithic resistors having resistances of a few hundred ohms. Monolithic PNP transistors tend to have very poor frequency responses. More specifically, the unity gain frequency of such PNP's may be around 20 MHz whereas the unity gain for NPN's 12 and 14 may be in the several gigahertz range. The PNP transistors included in current sources 34 and 40 and in current sources 46 and 48 are not required to switch at high frequencies as is the case with PNP devices frequently included in differential-to-single ended converters commonly utilized in some prior art differential amplifier circuits. Hence, differential amplifier 11 can be utilized at much higher frequencies than such prior art circuits. Also such monolithic PNP's have a lower beta and more capacitance than monolithic NPN's.

The common mode voltage of differential amplifier 11 is defined as one half the sum of the voltages at terminals 220 and 224 with respect to ground. Load circuitry connected between terminal 220 and 224 such as multiplier circuits require that the common mode voltage remain constant. Under ideal dynamic operating conditions, the magnitude of the voltage on terminal 220 decreases as the magnitude of the voltage on terminal 224 increases such that their sum and hence the common mode remains constant. Unfortunately, changes in temperature, for instance, may cause current sink 22 to undesirably draw an increased amount of current from node 20 which would cause the collector voltages on both transistors 12 and 14 to decrease thereby undesirably reducing the common mode voltage.

Signal processing circuit 10 includes control circuitry for keeping the common mode voltage at or near a desired constant, settable level. More specifically, a coupling circuit including NPN emitter follower transistors 50 and 52 is connected between terminal 42 and through resistor 53 to node 54. The collector electrode of transistor 50 is coupled through load resistor 55 to positive power supply terminal 38 and through frequency stabilization capacitor 56 to terminal 42. Transistor 50 also has a base electrode directly connected to terminal 42 and an emitter electrode connected to both the base electrode of transistor 52 and to the collector electrode of NPN current sink transistor 58. Resistor 59 connects the emitter of transistor 58 to negative power supply terminal 32. Transistor 52 further has a collector electrode connected to the positive supply conductor 38 and an emitter electrode connected through resistor 53 to terminal 54.

Similarly, emitter follower transistors 60 and 62 connect terminal 44 through resistor 63 to node 54. Resistors 53 and 63 serve to provide at node 54 one-half of the sum of the voltages at output nodes 220 and 224. More specifically, transistor 60 includes a collector electrode which is coupled through load resistor 64 to positive power supply terminal 38, a base electrode directly connected to terminal 44, and an emitter electrode which is connected both to the base electrode of transistor 62 and to NPN current sink transistor 66. Resistor 67 connects the emitter electrode of transistor 66 to negative supply terminal 32. Transistor 62 has a collector electrode connected directly to positive power supply conductor 38 and an emitter electrode which is connected through resistor 63 to control node 54. Capacitor 57 is connected between the collector of transistor 60 and terminal 44.

Common mode voltage control differential amplifier 70 includes an NPN transistor 72 having a collector electrode connected to positive supply conductor 38, a base electrode connected to terminal 54, and an emitter electrode connected to node 74. NPN transistor 76 includes a collector electrode connected to node 78 which is also connected to PNP current source 46, an emitter electrode connected to the emitter of transistor 72 at node 74, and a base electrode which is coupled through resistor 79 to terminal 80. Terminal 80 is adapted to receive a regulated voltage from an external source shown in FIG. 2 for determining the magnitude of the common mode voltage between output terminals 220 and 224. Controllable current sink 82 includes NPN transistors 84 and 86 each having collector electrodes connected at node 88 and base electrodes connected together by conductor 90. Resistors 92 and 94 respectively connect the emitters of transistors 84 and 86 to the negative power supply potential conductor 32.

Level shifting zener diode 100 includes a cathode connected to node 78 and an anode connected to control node 102 which is connected to the base electrode of NPN buffer transistor 104. Frequency stabilization capacitor 106 is coupled between the emitter and collector electrodes of transistor 104 to round off the gain of transistor 104 at high frequencies for frequency stabilization. Resistor 108 connects the collector electrode of transistor 104 to positive power supply terminal 38 and conductor 109 connects the emitter electrode of transistor 104 to the base electrode of master current sink NPN transistor 110 which has a collector electrode connected to node 102 and an emitter electrode coupled through resistor 112 to negative supply conductor 32. Transistor 104 buffers terminal 102 so that transistor 110 does not draw too much base current out of node 102.

Current control transistor 118 has a base electrode connected to terminal 120, a collector electrode connected to terminal 122 and to the collector electrode of PNP transistor 124 included in PNP current source 48. PNP transistor 124 includes an emitter electrode which is coupled through resistor 126 to positive power supply terminal 40 and a base electrode which is connected to terminal 128. In operation, a capacitor would be coupled between terminals 122 and 128 as shown in FIG. 2 to provide frequency stabilization.

Figure 2:
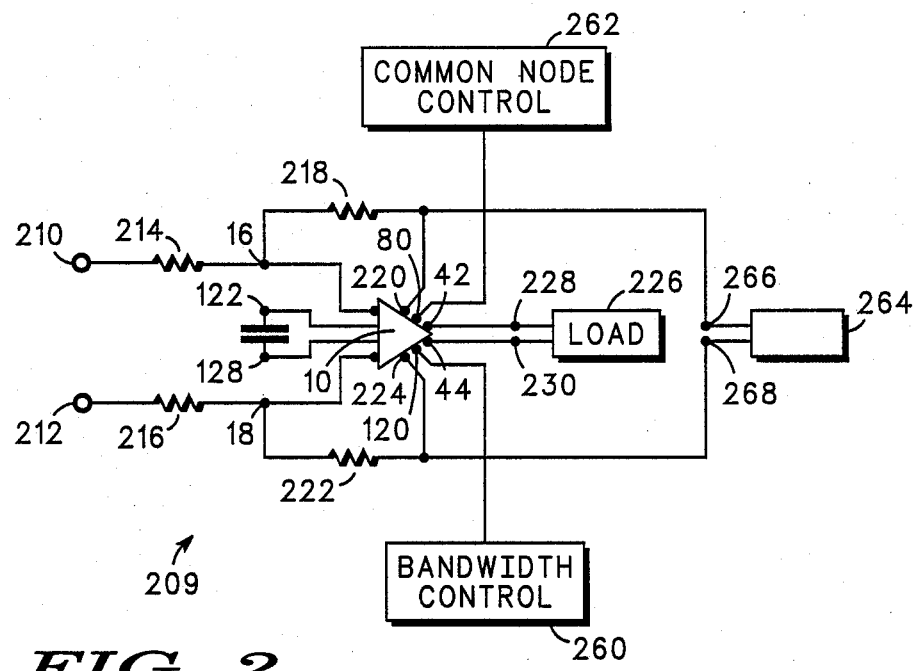
FIG. 2 is a partial block and partial schematic diagram illustrating how the differential amplifier of FIG. 1 can be connected to provide a filter.

During quiescent operation, a voltage of a fixed, settable magnitude would be applied to current control terminal 120 by a bandwidth control circuit, as shown in FIG. 2, thus enabling transistor 118 to sink a current of constant magnitude from power supply terminal 38 through transistor 124 and resistor 126. The emitter current of transistor 118 biases on NPN current sink 82 and current sink 130 which includes an NPN transistor 132 having a collector electrode connected to conductor 109, an emitter electrode coupled through resistor 134 to negative supply terminal 32 and a base electrode which is connected to the emitter of current control transistor 118 through conductor 90 and resistor 121. Buffer circuit 136 includes PNP transistors 138, 140 and 142. Buffer 136 tends to keep the base current from PNP current sources 48, 34, 46 and 40 from adversely affecting the operation of current control transistor 118. The resistance of resistor 126 may be four hundred ohms to minimize the voltage drop thereacross. The emitter-to-collector current of PNP transistor 124 is defined as having a magnitude of "1 I". Current source 34 includes 4 PNP transistors having emitters commonly connected together at node 144, bases commonly connected together by conductor 146, and their collectors commonly connected together at node 148. Conductor 146 connects the bases of source 34 to the base of transistor 124. Since the resistance of resistor 36 is equal to one-fourth the resistance of resistor 126, current supply 34 will provide a current at node 148 having a magnitude of 4 I.

Similarly, current supply 46 includes 5 PNP transistors, the emitters of 4 of which are connected together at node 150, which is connected through 100-ohm resistor 152 to positive power supply 38. These 5 PNP transistors have their bases connected together by conductor 146 and their collectors connected together at node 154. Resistor 156 is a 400-ohm resistor which connects the emitter of transistor 59 which is of the 5 PNP transistors of source 46 to positive supply terminal 38. Hence, PNP current supply 46 provides a current of 5 I at node 154 which is connected to node 78.

Moreover, PNP current source 40 includes 4 PNP transistors having their emitters connected together at node 157, bases connected together by conductor 146 and collectors connected together at node 158. Emitter resistor 47 of source 40 has a resistance equal to that of emitter resistors 152 and 36. Hence, PNP current source 40 will provide a current of 4 I at node 158.

Thus, current source 22 of signal processor differential amplifier 11 will conduct a current of 8 I which is equal to sum of the 4 I currents conducted by differential transistors 12 and 14. The 5 I current from PNP current source 46 flows to node 78. Transistors 76 and 72 each conduct about I to power up supply current sink 82 and zener diode 100 conducts 4 I to power up current sink 110 and buffer amplifier 104. The magnitude of "I" can be increased by causing the control voltage on terminal 120 to increase in the positive direction. This increases the bandwidth of differential amplifier 11 which is known to vary directly with the amount of the main or emitter-to-collector currents of transistors 12 and 14.

The operation of the common mode voltage compensation will be described next. Assume the common mode voltages on terminals 220 and 224 undesirably simultaneously increase because of some instability such as a temperature induced change in one of the PNP current sources causing an undesired decrease in the current of current sink 22, for instance. In this case, the increased common mode voltages will be provided by emitter follower transistors 50 and 52 and by emitter follower transistors 60 and 62 via resistors 53 and 63 to terminal 54. Differential amplifier 70 will compare this increased voltage to the desired magnitude provided on terminal 80. Consequently, transistor 72 will be rendered more conductive and transistor 76 will be rendered less conductive. Transistor 76 will then draw less current from terminal 78 thereby causing the current through master current sink transistor 110 to increase. Accordingly, the base-to-emitter voltage of transistor 110 and the voltage drop across resistor 112 will increase the voltages on the base electrodes of transistors 24 and 26 of current sink 22. Thus current sink 22 will draw more current from node 20 thereby tending to reduce the otherwise undesirably increased common mode output voltages occurring at terminals 220 and 224.

Likewise if the common mode voltages at output terminals 220 and 224 tend to undesirably decrease, the voltage drive at terminal 54 for transistor 72 will decrease thereby causing transistor 76 to draw more current from node 78 resulting in less drive being provided to transistor 110 and hence to current sink 22. This will tend to increase the common mode output voltage. Thus, common mode differential amplifier 70, master current sink transistor 110, and current sink 22 provide a feedback loop for regulating the common mode voltage at terminals 42, 44, 220 and 224.

Diode connected transistor 160 has an emitter electrode coupled through resistor 162 to negative power supply conductor 32, a collector electrode which is to the base electrode thereof and to conductor 90. Transistor 160 regulates the drive to all of the NPN transistors connected to conductor 90.

Output pull down circuitry includes portion 170 which has a node 172 that is coupled through buffer transistors 50 and 52 to terminal 42 and another portion 174 which includes a node 176 which is coupled through buffer transistors 60 and 62 to terminal 44. Portion 170 includes diode connected NPN transistor 178 having a base and collector electrode which are coupled together by conductor 180. Transistor 178 also has an emitter electrode which is coupled through resistor 182 to the negative supply conductor 32. The collector electrode of transistor 178 is also coupled through resistor 184 to positive power supply conductor 38. Transistor 178 establishes a bias potential on conductor 186 which is connected to the base electrodes of NPN transistors 188, 190, 192 and 194. Commonly connected collector electrodes of transistors 188 and 190 of portion 170 are connected to node 172. Resistors 196 and 198 connect the emitter electrodes of respective transistors 190 and 188 to negative supply terminal 32. Transistors 192 and 194 have common collector electrodes connected to node 176, common base electrodes connected to conductor 186. Resistors 200 and 202 respectively connect the emitter electrodes of NPN transistors 192 and 194 to the negative power supply conductor 32. Pull down circuits 170 and 174 enable discharging of a capacitive load connected between terminals 220 and 224.

FIG. 2 shows a connection of monolithic signal processing circuitry 10 as a filter 209. The signal to be filtered is applied in differential form to input terminals 210 and 212 which are respectively coupled through resistors 214 and 216 to input terminals 16 and 18 of signal processing differential amplifier 11 of FIG. 1. Feedback resistor 218 is coupled between input terminal 16 and output terminal 220 which is connected to emitter follower transistor 52 of FIG. 1. Resistor 222 is connected between input terminal 18 and output terminal 224 which is connected to emitter follower transistor 62 of FIG. 1. Load 226 is connected between terminals 42 and 44 of differential amplifier 11 of FIG. 1.

Figures 3A, 3B, 3C, 3D:
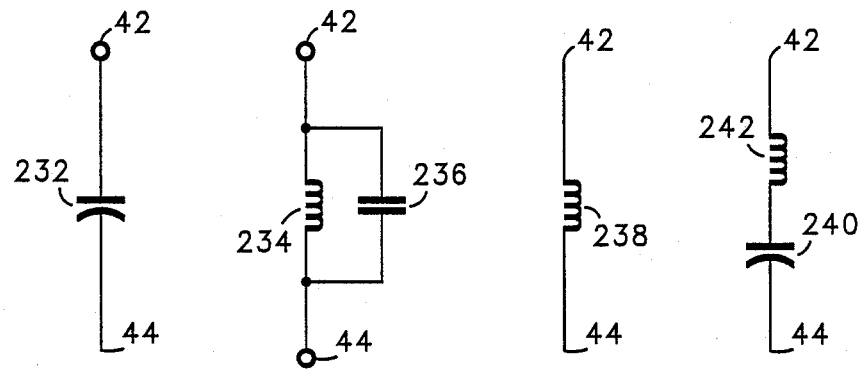
FIGS. 3A, 3B, 3C and 3D show a variety of reactive networks which may be employed in the filter circuitry of FIG. 2.

FIG. 3 indicates some of the many possible networks which can be connected between terminals 228 and 230 of load 226 of FIG. 2 to provide various characteristics for filter 209. More specifically, capacitor 232 of FIG. 3A can be utilized for low pass filter applications, parallel connected inductor 234 and capacitor 236 of FIG. 3B can be utilized for band pass applications, inductor 238 of FIG. 3C can be utilized for high pass filter applications and series connected capacitor 240 and inductor 242 of FIG. 3D can provide band reject circuitry. A switch (not shown) can be provided to connect any one of the networks of FIG. 3 between terminals 42 and 44 to enable filter 209 to have any one of a variety of frequency selective characteristics. As previously mentioned the bandwidth of these characteristics can be varied by varying the control voltage on terminal 120 of circuit 10 of FIG. 1.

Figure 4:
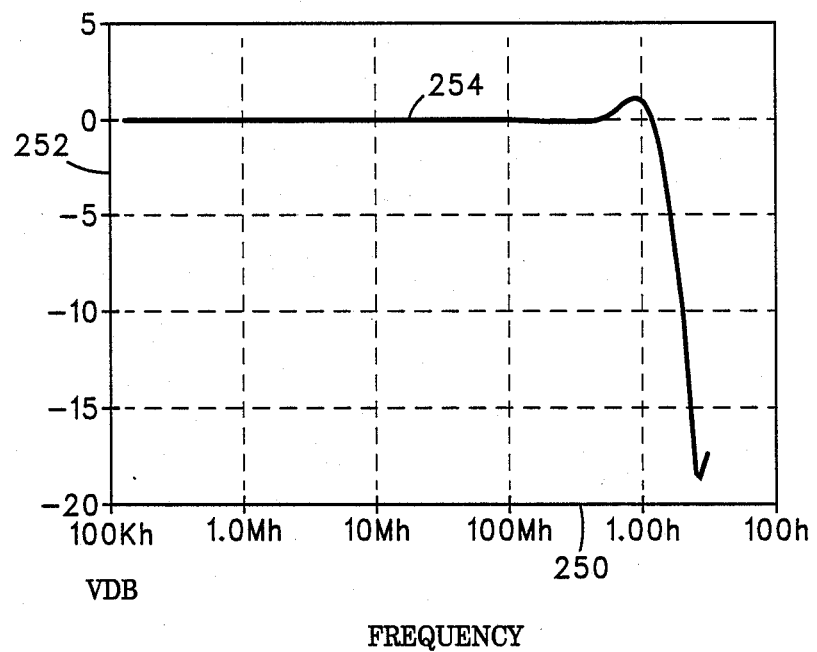
FIG. 4 shows a band pass characteristic for a low pass filter provided according to FIG. 2.

FIG. 4 illustrates a low pass characteristic for single pole filter 209 wherein a capacitive load such as 232 is provided. FIG. 4 includes an abscissa axis 250 for measuring frequency and an ordinate axis 252 indicating decibels (DB). As shown, the DB to frequency characteristic 254 is relatively flat over the frequency range from 100 kilohertz to 1 gigahertz for a particular low pass filter configuration in accordance with one embodiment of the invention.

What has been described is a signal processing circuit 10 which is operable from d.c. up through very high RF frequencies. Signal processing circuit 10 is suitable for being manufactured in monolithic integrated circuit form with readily available, inexpensive components. Moreover, signal processing circuitry 10 can be utilized in the form of a filter as shown in FIG. 2. In this case, current control provided on terminal 120 by bandwidth control circuit 260 enables ready adjustment of the bandwidth such as that required fast by acquisition receivers, for instance. Adjustment of this current also allows control over power dissipated by and the gain of circuit 10. The current control is accomplished without creating transients or undesirable shifts in bias levels.

Moreover, common mode control is provided by circuitry 262 connected to control terminal 80 also shown in FIG. 2 to enable precise control of the common mode voltage occurring between terminals 220 and 224 so as to meet the varying requirements of different direct or d.c. coupled loads such as 264 having terminals 266 and 268 coupled to load 226 as shown in FIG. 2. Load 264 connected between terminals 220 and 224, for instance, could be a multiplier circuit requiring d.c. coupling so that low frequency components of the output signal of filter 209 are preserved, for instance.

PNP current sources 34 and 40 of FIG. 1 enable differential amplifier 11 to have a high gain without detrimentally effecting the gain at RF. Circuit 10 includes several buffer stages to compensate for undesirable level shifts otherwise caused by these PNP devices or other sources. Circuit 10 has desirable linearity and dynamic range characteristics.

While the invention has been described in conjunction with a specific embodiment thereof, it is evident that many alterations, modifications and variations will be apparent to those skilled in the art in light of the foregoing description. Accordingly, the invention is intended to embrace all such alterations, modifications and variations in the appended claims.

I claim:

1. In a signal processing circuit having a first pair of output terminals, each of the first pair of output terminals providing an output potential, each output potential having a magnitude, the output potentials further having an average magnitude, and wherein it is desired that the average magnitude of the output potentials on the first pair of output terminals be controlled to remain at a substantially constant level, a regulator for controlling the average magnitude including in combination:

output potential control means having a control terminal and a second pair of output terminals, said second pair of output terminals of said output potential control means being coupled to the first pair of output terminals of the signal processing circuit, said output potential control means being adapted to control the average magnitude in response to a control signal;

first transistor means having input, output and control electrodes, second transistor means having input, output and control electrodes, said input electrodes being coupled together at a first node so that said first and second transistor means provide a first differential pair;

first current sink means coupled to said first node;

first circuit means coupling the first pair of output terminals of the signal processing circuit to said control electrode of said first transistor means said first differential pair and said first current sink means responding to undesirable changes in the magnitudes of the potential on the first pair of output terminals of the signal processing circuit to provide a control signal at said output electrode of said second transistor means; and second circuit means coupling said output electrode of said second transistor means to said control terminal of said output potential control means for applying said control signal thereto, said output potential control means responding to said control signal to adjust the average magnitude of the output potentials (back) to the substantially constant level.

2. The signal processing circuit of claim 1 wherein said output potential control means further includes third transistor means having input, output and control electrodes, and fourth transistor means having input, output and control electrodes, said input electrodes of said third and fourth transistor means being connected together at a second node so that said third and fourth transistor means form a second differential, said output electrodes of said third and fourth transistor means providing said second pair of output terminals; and second current sink means for sinking a current having a magnitude, said second circuit sink means being connected to said second node of said second differential pair, said second current sink means having a control terminal coupled to said control terminal of said output potential control means, said second differential pair and said second current sink means thereby providing a differential amplifier, the common mode voltage between the output electrodes of said third and fourth transistors being controlled in response to said control signal.

3. The signal processing circuit of claim 2 wherein said second current sink means further includes buffer circuit means.

4. The signal processing circuit of claim 2 wherein said second differential pair have a bandwidth controlled by said second current sink means, and the signal processing circuit further including third circuit means to adjusting said magnitude of the current of said second current sink means foro thereby adjust the bandwidth of said second differential pair.

5. The signal processing circuit of claim 1 wherein said first circuit means further includes buffer circuit means.

6. The signal processing circuit of claim 1 further including voltage reference means coupled to said control electrode of said second transistor means.

7. In a differential amplifier having a first pair of differentially connected transistors each having input, output and control electrodes, said input electrodes being connected together at a first node, each of the output terminals providing an output potential, the resulting output potentials having an average magnitude, wherein it is desired that the average magnitude of the output potential magnitudes on the output electrodes of the first differential pair be regulated to a substantially constant level, a common mode regulator for controlling the average of the output potential magnitudes including in combination:

first variable current sink means having a control terminal and an output electrode, said output electrode of said first variable current sink means being connected to said first node, said first variable current sink means being responsive to signals applied to said control terminal thereof the vary the average common mode output potential magnitudes of the first differential pair;

third transistor means having input, output and control electrodes, fourth transistor means having input, output and control electrodes, said input electrodes of said third and fourth transistor means being connected together at a second node to provide a second differential pair;

second current sink means being connected to said second node;

first circuit means coupling the output electrodes of the first and second transistors to said control electrode of said third transistor means;

conductive means adapted to apply a regulated voltage to said control electrode of a said fourth transistor means so that said second differential pair can compare the common mode potential to said regulated magnitude and provide a control signal on the output electrode of said fourth transistor, said control signal having a magnitude proportional to the difference in magnitude between said regulated and common mode potentials; and second circuit means coupling said output electrode of said fourth transistor means to said control electrode of said first variable current sink means, said first variable current sink means responding to said control signal to regulate the average of the potential magnitudes on the output electrodes of the transistors of the first differential pair.

8. The differential amplifier circuit of claim 7 having a bandwidth being utilized in a filter circuit and further including;

means for controlling the main currents between the input and output electrodes of the first and second transistors to provide control over the bandwidth of the differential amplifier circuit and reactive network means coupled between the output electrodes of the first and second transistors.

9. The differential amplifier circuitry of claim 7 wherein said first circuit means further include buffer amplifier means.

10. The differential amplifier of claim 7 further including PNP current sources coupled to the output electrodes of the first differential pair to facilitate high gain.

11. The differential amplifier circuit of claim 7 being provided in monolithic integrated circuit form.

* * * * *

UNITED STATES PATENT AND TRADEMARK OFFICE
CERTIFICATE OF CORRECTION

PATENT NO. : 4,825,173

DATED : April 25, 1989

INVENTOR(S) : Frank N. Cornett

It is certified that error appears in the above-identified patent and that said Letters Patent is hereby corrected as shown below:

Column 9, claim 2, line 42, after the word "differential", insert the word --pair--.

Column 9, claim 4, line 64, delete the first word "to" and insert --for--; line 65, delete the word "foro" and insert --to--.

Signed and Sealed this

Twenty-sixth Day of December, 1989

*Attest:*

JEFFREY M. SAMUELS

*Attesting Officer*   *Acting Commissioner of Patents and Trademarks*